Dec. 13, 1966 F. D. OLNEY, JR., ETAL 3,292,051

ASSEMBLY INCLUDING CIRCUIT ELEMENTS WELDED TO A COMMON CONDUCTOR

Filed Dec. 27, 1963

INVENTORS
FRED D. OLNEY, JR. AND
BY DONALD R. PRICE

Warren F.B. Lindsley

ATTORNEY

United States Patent Office 3,292,051
Patented Dec. 13, 1966

3,292,051

ASSEMBLY INCLUDING CIRCUIT ELEMENTS WELDED TO A COMMON CONDUCTOR

Fred D. Olney, Jr., and Donald R. Price, Phoenix, Ariz., assignors to General Electric Company, a corporation of New York Filed Dec. 27, 1963, Ser. No. 333,825
3 Claims. (Cl. 317—101)

This invention relates to electrical connections and more particularly to a method of connecting a plurality of electrical circuit elements to a conductor. The invention is also relaetd to a new and improved assembly of electrical circuit elements for use on a circuit board.

In the manufacture of electronic equipment and particularly that which utilizes circuit board structures, the ease of manufacture and the reliability of the assembled structure become important. The advantages of subassembling a plurality of circuit elements such as, for example solid state type components, and then applying the subassembly to a circuit board has also proven desirable. In spite of the time and labor saving benefits of using such a subassembly, this method has not been completely satisfactory because the subassembly often requires a plurality of welding schedules of various heats and pressure settings in order to make metallurgical sound welds for all of the lead wire connections of the various circuit elements used. Even the welding of similar circuit elements to a common conductor has been a problem in high speed subassembly work since the alloy materials and coatings of the lead wires of similar circuit elements received from the same or different vendors varies.

Accordingly, a new and improved method for attaching one or more electrical circuit elements to a conductor is provided as well as a novel subassembly of electronic components. The method disclosed comprises the steps of attaching one or more electrical circuit elements to a common conductor by sliding a metallic sleeve of a given diameter over the end of at least one of the lead wires of each of the electrical elements, pressing the sleeves surrounding the ends of the wires and the conductor together and conductively connecting the sleeves to the lead wires of the circuit elements and to the conductor by welding. The new method and the resulting subassembly disclosed herein overcomes the problems resulting from the large variation in diameter and materials of the lead wires of similar or different electric circuit elements.

Therefore, one of the objects of this invention is to provide a new and improved method of attaching one or more circuit elements to a conductor.

Another object of this invention is to provide a new and improved method of welding lead wires of various circuit elements to a common conductor utilizing one heat and pressure setting for various alloy materials, coatings and size conditions of the lead wires.

A further object of this invention is to provide a new and improved subassembly of electrical circuit elements.

A still further object of this invention is to provide a new and improved subassembly of electrical elements in which the lead wires of the elements are rendered capable of being welded to a common conductor with the same pressure and heat setting conditions of the welding equipment.

Other objects and advantages of the present invention will be apparent from the following specification when taken in conjunction with the accompanying drawing in which.

Figure 1:
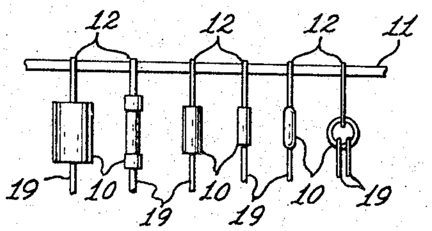
FIG. 1 illustrates a plurality of circuit elements welded to an elongated conductor.

Referring more particularly to the drawing by characters of reference, FIG. 1 discloses a plurality of commercial circuit elements 10 such as, for example, transistors, diodes, resistors, capacitors, choke coils, etc., symbolically shown and suitably attached to an elongated conductor 11 such as, for example, by welding. The lead wires of the circuit elements are shown to be of various diameters as found in commerce and are usually formed from metals of different alloy consistencies. Further, the lead wires of various circuit elements usually have different types of metallic coatings. Therefore, when welding a plurality of these circuit elements to a common conductor, various weld conditions must be used since the pressure and temperature condition necessary for metallurgically sound welds may be different for each of the lead wires. Thus, the setup conditions of the welding equipment must be changed to accommodate the various sizes and materials of the lead wires of the circuit elements. Unknown alloy materials for lead wires of the same or different circuit elements must be determined in order to classify the circuit elements for creating a weld schedule for production line assembly effort. Intermixing various vendors' products only compounds the problem.

Figure 2:
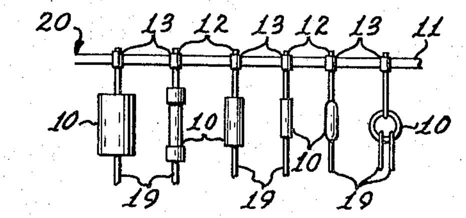
FIG. 2 illustrates a plurality of circuit elements, each having a sleeve placed around an end of one of its lead wires and the lead wire and sleeve then welded to an elongated conductor and embodying the invention.
Figure 3:
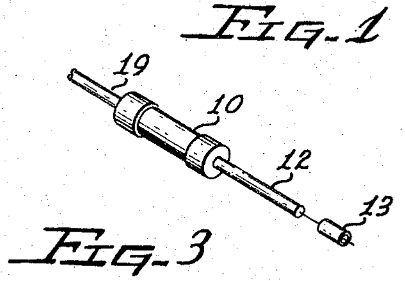
FIG. 3 is an exploded perspective view of a circuit element such as a resistor and one of the sleeves shown in FIG. 2.

FIGS. 2 and 3 illustrate a solution to the problem of the prior art wherein a tube or sleeve 13 is placed over the lead wires 12 of the various circuit elements 10 and the sleeve 13 and lead wire 12 are then welded to the elongated conductor 11. The sleeve 13 is so chosen that it will readily slip over the lead wires of the various components and for the commercial range of transistors, diodes, resistors, capacitors, choke coils, etc., found in the market place, a .040 inch inside diameter nickel sleeve will suffice in general applications. This sleeve may have, for example, a wall thickness of .003 inch and it may be approximately .08 inch long. As will be readily apparent, any sleeve length, diameter, wall thickness and material may be used to fit the particular project at hand; however, the above-identified specifications provide a sleeve which is satisfactory for the circuit elements mounted on the present day circuit boards.

Figure 4:
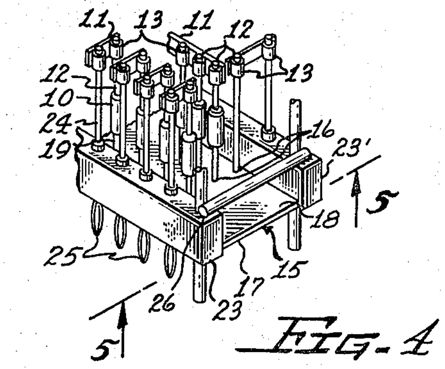
FIG. 4 is a perspective view of a module construction of the circuit elements shown in FIGS. 2 and 3 mounted on a circuit board.
Figure 5:
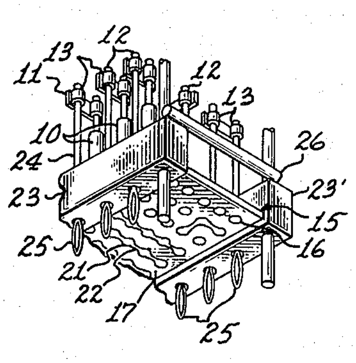
FIG. 5 is a perspective bottom view of the structure shown in FIG. 4.

FIGS. 4 and 5 illustrate perspective views of a module circuit board construction embodying the invention and comprising a plurality of circuit elements 10 mounted on an insulating sheet or board 15. Board 15 is provided with a plurality of spaced apertures 16 which communicate with the lower and upper surfaces 17 and 18, respectively, of the board.

In accordance with the invention claimed, a plurality of circuit elements 10 are interconnected each through one of its lead wires 12 to the common conductor 11 to form a subassembly 20. Conductor 11 may be a ribbon, wire, bar or any other suitable configuration serving as a common conductor for all of the circuit elements associated with it. The lead wires of the various circuit elements may be formed from like or different metals or alloys and have like or different diameters and conductive coatings. A metallic sleeve having a diameter large enough to pass over all of the ends of the lead wires of the circuit elements 10 used, is placed over one of the ends of each of the lead wires to be connected to conductor 11.

The sleeves and lead wires of the various circuit elements are then fastened together and to the common conductor 11 by joining such as by a resistance welding technique. Even though the lead wires of the various circuit elements may be formed of copper, nickel, steel or various combinations and alloys of these metals with various coatings and coating thickness, a .040 inch diameter nickel sleeve, .003 inch thick and .08 inch long placed on the lead wires of various commercial circuit elements may be used. This sleeve, when assembled as described, is then pressed to the lead wire which may not cause deforming of the sleeve.

The sleeve, lead wire and conductor are then welded together. Approximately 65 watt seconds of energy is applied to the pressed sleeve, lead wire and conductor for creating the desired metallurgical weld. The selected welding current pulse is applied over a period of approximately 1.5 milliseconds. Sixteen pounds of pressure may be applied to the work pieces. Although this welding schedule will provide a metallurgically sound weld for each of the lead wires used in the defined sleeve, nevertheless, it should be noted that any other suitable welding schedule including other welding techniques may be used particularly for different sleeve sizes. With the method disclosed, all of the circuit elements associated with a given conductor may be welded to the conductor with one setting and welding schedule.

Subassembly 20, comprising the various circuit elements 10 is then fastened to circuit board 15. This is accomplished through the placing of the free ends of the lead wires 19 of the circuit elements 10 in given spaced apertures 16 in board 15. Lead wires 19 are then connected to the lower surface 17 of the circuit board in any suitable manner such as by soldering. Lead wires 19 may be interconnected on the bottom surface of board 15 by suitable interconnecting conductive materials as shown at 21 and 22 in FIG. 5. As noted in FIGS. 4 and 5, the common conductors 11 are juxtapositioned with reference to the upper surface of the circuit board 15 by the circuit elements 10 when the module assembly is constructed.

In FIG. 4, ridges 23, 23', formed of a suitable insulating material, are used to reinforce the circuit board structure and also to provide a more rigid support than the circuit board itself for through type conductors 24. Conductors 24 are provided with plug-in prongs 25 at one end and are connected in accordance with the invention at the other end to one of the common conductors 11. The ridges also may be reinforced by one or more interconnecting bars 26.

Figure 6:
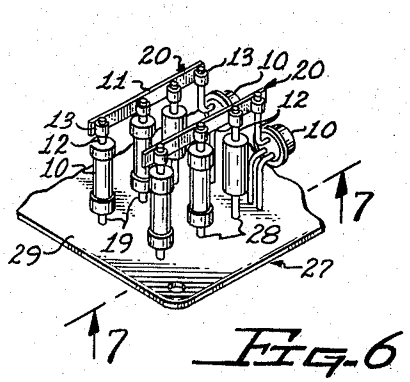
FIG. 6 is a modification of the structure shown in FIG. 5.
Figure 7:
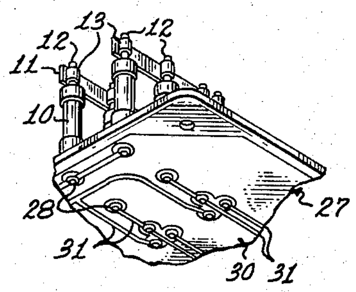
FIG. 7 is a perspective bottom view of the structure shown in FIG. 6.

FIGS. 6 and 7 illustrate a further modification of the structure shown in FIGS. 4 and 5 wherein a circuit board 27 is shown comprising an insulating sheet provided with a plurality of apertures 28 which communicate with the upper and lower surfaces 29 and 30, respectively, of the board. The edges of the apertures in the lower surface of the circuit board are interconnected in a predetermined manner by conductors 31 either placed on the lower surface of the board or embedded in its surface in a known manner. Suitable subassemblies of the circuit elements 10 and associated common conductors 11, as described for FIGS. 4 and 5, are mounted on the upper surface of the board. The lead wires of the circuit elements 10 protruding through apertures 28 in the circuit board are connected to conductors 31 shown on the lower surface of the board in any suitable manner such as by soldering.

Thus, in accordance with the invention claimed, a new and improved method of construction and subassembly of circuit elements is provided. This method makes possible the rapid assembly of commercially available circuit elements by utilizing only one standardized welding schedule, rather than a plurality of welding schedules, for all the circuit elements used.

While the principles of the invention have now been made clear in an illustrative embodiment, there will be immediately obvious to those skilled in the art many modifications of structure, arrangement, proportions, the elements, materials, and components, used in the practice of the invention, and otherwise, which are particularly adapted for specific environments and operating requirements without departing from those principles. The appended claims are therefore intended to cover and embrace any such modifications, within the limits only of the true spirit and scope of the invention.

What is claimed is:

1. An electrical wiring board assembly comprising a board of insulating material, a conductor spaced from and juxtapositioned to said board, a plurality of electrical circuit elements each having a pair of lead wires, a pair of metallic sleeves one arranged on an end of each of said lead wires, weld means for conductively connecting each of said sleeves to said conductor and the end of each of said lead wires, and means for connecting the other end of each of said lead wires to said board.

2. An electrical wiring board assembly comprising a panel board of insulated material, an elongated conductor arranged juxtapositioned to said board, a plurality of electrical circuit elements each having at least a pair of lead wires, a plurality of metallic sleeves one arranged on the end of a given lead wire of each of said elements, weld means for conductively connecting each of said sleeves to said conductor and to the end of the given lead wire of each of said elements, and means for connecting the other lead wire of each of said elements to said board, whereby said conductor is spaced from the surface of said board by said elements.

3. An electrical wiring board assembly comprising a printed circuit panel board of insulated material, a flat elongated conductor arranged juxtapositioned to said board, a plurality of electrical circuit elements each having at least a pair of lead wires, said lead wires of different elements varying in diameter, a plurality of metallic sleeves one arranged on an end of a given lead wire of each of said elements, weld means for conductively connecting each of said sleeves to said conductor and to the given lead wires of each of said elements, and means for connecting the other lead wire of each of said elements to said board, whereby said conductor is spaced from the surface of said board by said elements.

References Cited by the Examiner

UNITED STATES PATENTS

| | | | |
|---|---|---|---|
| 2,884,612 | 8/1953 | Bang. | |
| 2,915,678 | 12/1959 | Frazier et al. | |
| 3,083,261 | 3/1963 | Francis et al. | |
| 3,125,706 | 3/1964 | Long | 339—198.3 |
| 3,213,325 | 10/1965 | Lindstrand. | |

ROBERT K. SCHAEFER, *Primary Examiner.*

M. GINSBURG, *Assistant Examiner.*